United States Patent [19]

Kato

[11] Patent Number: 4,961,629

[45] Date of Patent: Oct. 9, 1990

[54] LIQUID CRYSTAL DISPLAY DEVICE

[75] Inventor: Hiroaki Kato, Nara, Japan

[73] Assignee: Sharp Kabushiki Kaisha, Osaka, Japan

[21] Appl. No.: 250,370

[22] Filed: Sep. 28, 1988

[30] Foreign Application Priority Data

Nov. 6, 1987 [JP] Japan .................................. 62-281383

[51] Int. Cl.⁵ .............................................. G02F 1/13
[52] U.S. Cl. ................................... 350/332; 350/334; 350/336; 357/4
[58] Field of Search ............... 350/333, 336, 334, 332; 357/4

[56] References Cited

U.S. PATENT DOCUMENTS 4,686,553  8/1987  Possin ............................. 350/334 X
4,778,258 10/1988  Parks et al. ......................... 350/336
4,816,885  3/1988  Yoshida et al. ................. 350/336 X
4,834,507  5/1989  Kato et al. ....................... 350/334 X
4,857,907  8/1989  Koden ............................. 350/336 X Primary Examiner—Stanley D. Miller
Assistant Examiner—Huy K. Mai

[57] ABSTRACT

A liquid crystal display device includes a plurality of thin film transistors formed on a transparent insulating substrate. Each of the thin film transistors is composed of a gate electrode formed on the transparent insulating substrate, and a semiconductor film formed on the gate electrode by the mediation of a gate insulation film. A protective insulating film is then formed on the semiconductor film. A metal thin film and a transparent conductive film, in this respective order, are then laminated on the protective insulating film to provide a source electrode and a drain electrode.

16 Claims, 3 Drawing Sheets (a)

(b)

(c)

(d)

LIQUID CRYSTAL DISPLAY DEVICE

BACKGROUND OF THE INVENTION

The present invention relates to a liquid crystal display device comprising thin film transistors, and relates specifically to the structure of the thin film transistor.

In recent years, in the active-matrix liquid crystal display device, studies have been actively carried out on the active-matrix substrates wherein thin film transistors (hereinafter referred to as TFT) are formed in a matrix arrangement on an insulating substrate. Semiconductor materials used for TFT include poly Si (polycrystalline silicon), a-Si (amorphous silicon), Te, and CdSe and others.

An example of the structure of the field effect TFT using a-Si, which is employed in the liquid crystal displaying apparatus, is shown by a planar view in FIG. 4 and a cross-sectional view in FIG. 5. FIG. 5 shows a cross-section taken along line B-B in FIG. 4. A gate electrode 21 of about 1000–about 4000 Å in thickness is formed on a transparent insulating substrate 20 such as a glass substrate, and a gate insulating film 22 of about 100–about 5000 Å in thickness. An a-Si film 23 of about 100–about 2000 Å in thickness, and a protective insulating film 24 of about 1000–about 6000 Å in thickness are laminated thereon consecutively without breaking vacuum by the plasma CVD method. Next, the protective insulating film 24 is patterned, and a P (phosphorus)-doped n+-a-Si film 25 of about 100–about 1000 Å in thickness and a source-drain metal film 26 are laminated. Patterning is then performed to form a source electrode 27 and a drain electrode 28 (the protective insulating film 24 is provided to protect the a-Si film 23 from an etchant in performing the n+-a-Si film 25 patterning). Furthermore, a pixel electrode 29 is formed in contact with the drain electrode 28. Thus, as is obvious from FIG. 4, a TFT and a pixel are formed at each point of intersection of a gate electrode line 30 and the source electrode 27 in an array shape.

Generally, in the active matrix substrate using TFTs, a TFT at of each point of intersection is driven by a line sequential method. This means that a scanning signal is inputted from one gate electrode line to be scanned, and a data signal is inputted from each source electrode line. The TFT is operated by the respective inputted signals and controls the ON/OFF of a current flowing into the drain electrode. It then selects the state of turn-on or turn-off of the pixel electrode connected to the drain electrode. The total number of TFTs connected t the pixel electrodes is large. For example, there are 87,500 pieces of TFTs in a 250×350 matrix. If a defect is produced among a large number of TFTs, a point defect is produced inevitably, and the yield rate of the display device is reduced.

A possible cause of the point defect is that an electrical connection breaks between the drain electrode and the source electrode, or in reverse, an electric short-circuit takes place in the channel part, and thereby the TFT cannot be controlled and normal display cannot be performed.

The TFT, having the above-mentioned structure, has a deficiency in that after patterning to form the source electrode 27 or the drain electrode 28, for example, using Ti, over-etching occurs on the step part (as shown by a mark X in FIG. 4) extending onto the gate electrode line 30. Thus, the resistance of the source electrode 27 or the drain electrode 28 is increased, or a break in the electric connection between the source electrode 27 and the drain electrode 28 is caused, and therefore a point defect is likely to be produced.

The present invention has been achieved in light of the above-mentioned circumstances, and its purpose is to provide a liquid crystal display device capable of improving the yield rate and the reliability of the TFTs.

SUMMARY OF THE INVENTION

The present invention relates to a liquid crystal display device comprising a plurality of thin film transistors formed on a transparent insulating substrate, in which each of the thin film transistors is composed of: a gate electrode formed on the transparent insulating substrate: a semiconductor film formed on the gate electrode by the mediation of a gate insulation film: a protective insulating film formed on the semiconductor film: and a metal thin film and a transparent conductive film in this order, laminated on the protective insulating film to provide a source electrode and a drain electrode.

For the semiconductor film in the present invention, a semiconductor material such as amorphous silicon or polycrystalline silicon is used.

Also, for the metal thin film forming the source electrode and the drain electrode, a Ti film or Mo film of about 1000–about 5000 Å in thickness is preferably used.

Furthermore, for the transparent conductive film laminated on the metal thin film, an indium tin oxide film of about 500–about 3000 Å in thickness is preferred.

DETAILED DESCRIPTION OF PREFERRED EMBODIMENTS

It is preferable that the liquid crystal display device of the present invention is an active-matrix type. The active-matrix liquid crystal display device provides a plurality of transparent electrodes disposed on a transparent insulating substrate, in a matrix fashion, to form pixels at locations where a thin film transistor is connected to each one of the transparent electrodes. Two or more thin film transistors can be connected to one transparent electrode. In this case, it is preferable that each source electrode, in each thin film transistor, be independently connected to an exterior circuit, through which the inspection of characteristics of each thin film transistor can be easily conducted.

Figure 1:
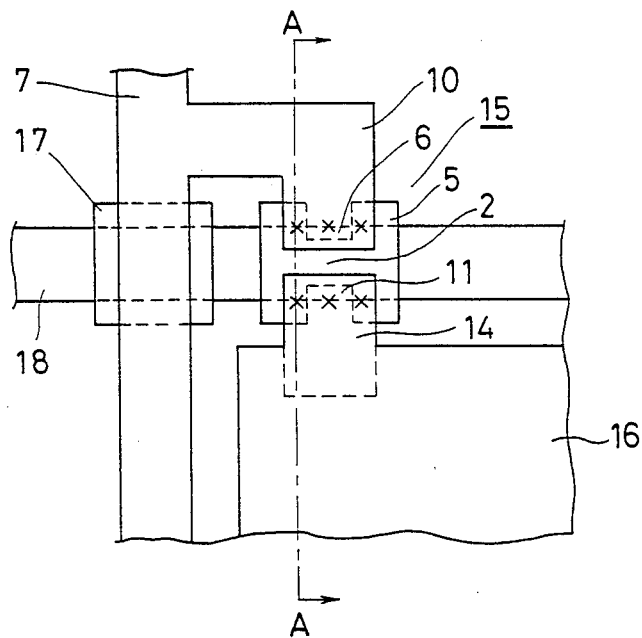
FIG. 1 is a magnification of the structure of the present invention showing the planar view of its surface.
Figure 2:
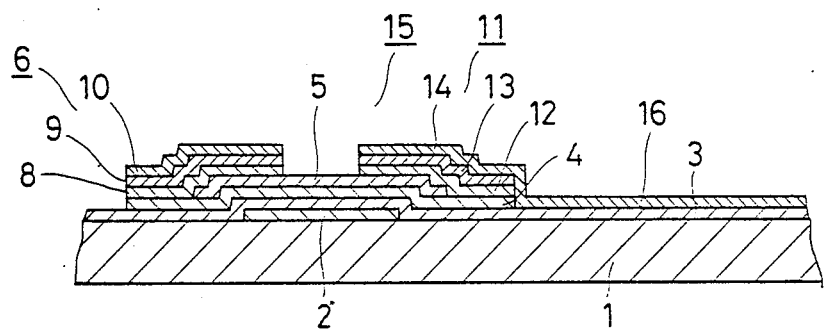
FIG. 2 is a cross-sectional view taken along line A—A in FIG. 1

Referring to FIG. 1 and FIG. 2, numeral 1 designates a transparent insulating substrate, for example, a glass substrate. Numeral 2 designates a gate electrode, which is formed in part of a gate electrode line 18 which has a predetermined size of width, for example, about 15 μm, and is formed in a belt shape on the transparent insulating substrate 1. An amorphous silicon film (hereinafter referred to as a-Si film) 4, being a semiconductor film, and a protective insulating film 5 are laminated in the above-mentioned order on a gate insulating film 3, for example, made from silicon nitride which is provided so as to cover the gate electrode 2. Numeral 6 designates a source electrode, which is provided on the protective insulating film 5 and is formed integrally with a source electrode line 7, formed at a right angle to the gate electrode line 18. The source electrode 6 is formed by having a Ti film 9 of metal thin film and a transparent conductive film 10 laminated in the order as stated above, on a phosphorus-doped n+-a-Si film 8 laminated on the protective insulating film 5. Similarly, a drain electrode 11 is formed by having a Ti film 13 of metal thin film and a transparent conductive film 14 laminated as in the order stated above, on a phosphorus-doped n+-a-Si film 12 laminated on the protective insulating film 5 opposite to the source electrode 6. The Ti films 9 and 13 may be replaced by Mo films. Also, for the respective transparent conductive films 10 and 14, ITO (Indium Tin Oxide) films are preferred. A thin film transistor 15 formed as described above. Numeral 16 designates a pixel electrode, and the transparent conductive film 14 constituting the drain electrode 11 is extended to the pixel region, and is laminated on the gate insulating film 3 extended likewise to the pixel region. Numeral 17 designates a protective film interposed between the source wiring 7 and the gate electrode line 18.

Figure 3:
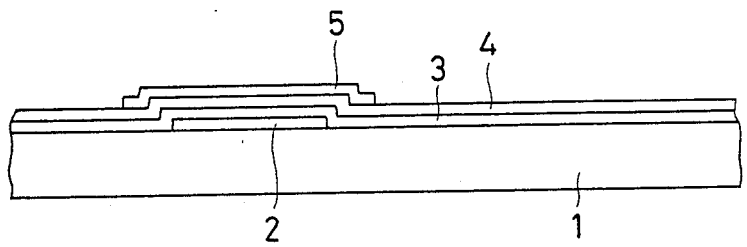
FIGS. 3a to 3d are cross sectional diagram showing the sequential nature of the manufacturing process of the present invention.
Figure 3:
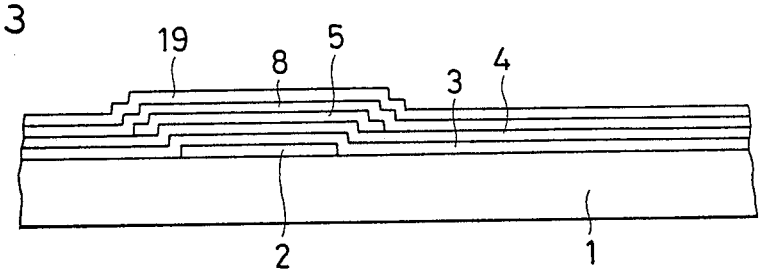
Figure 3:
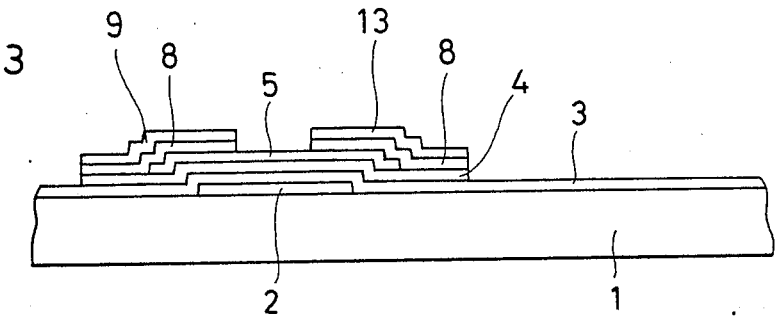
Figure 3:
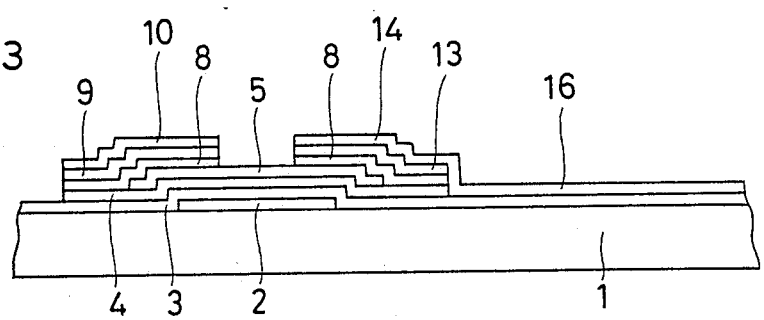
Figure 4:
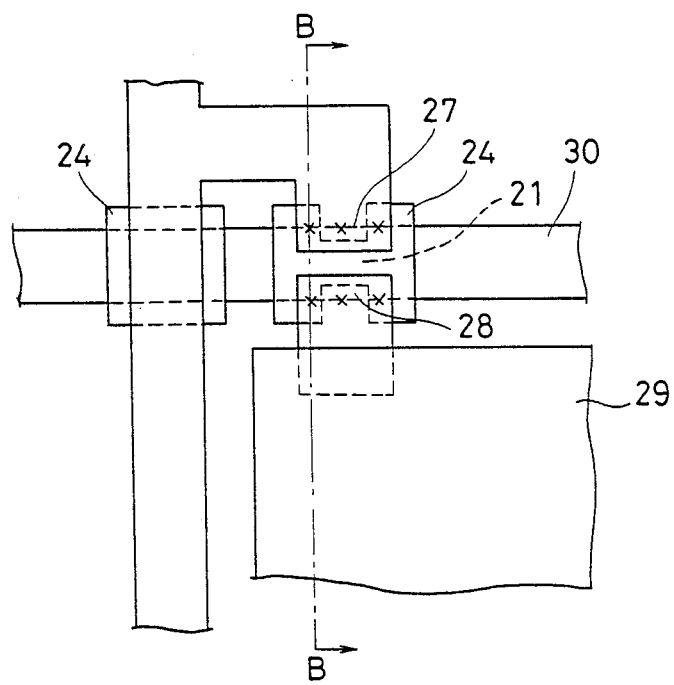
FIG. 4 is a view equivalent to FIG. 1 of a conventional example.
Figure 5:
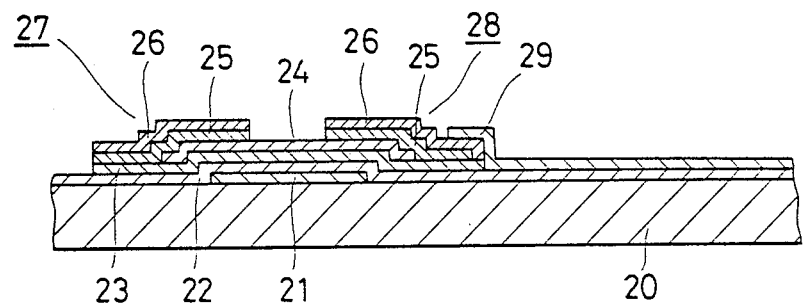
FIG. 5 is a cross-sectional view taken along line B—B in FIG. 4.

Next, description will be made as one example of the manufacturing process of this embodiment in reference to FIG. 3.

First, the gate electrode 2 of about 1000–about 4000 Å in thickness is formed on the transparent insulating substrate 1. Then, the gate insulating film 3 of about 1000–about 5000 Å in thickness, the a-Si film 4 of about 100–about 2000 Å in thickness, and the protective insulating film 5 of about 1000–about 6000 Å in thickness are consecutively laminated on the gate electrode 2 by the plasma CVD method without breaking vacuum. Thereafter, the protective insulating film 5 is patterned by etching (FIG. 3(a)).

Next, as shown in FIG. 3(b), the phosphorus-doped n+-a-Si film 8 of about 100–about 1000 Å in thickness and a Ti source drain metal layer 19 of about 100–about 5000 Å in thickness, for forming the source electrode 6 and the drain electrode 11, are laminated.

Thereafter, as shown in FIG. 3(c), the n+-a-Si film 8 and the source drain metal layer 19 are patterned to form into the Ti films 9 and 13 constituting the source electrode 6 and the drain electrode 11, respectively. Finally, as shown in FIG. 3(d), the transparent conductive film is laminated and thereafter patterned to form into the transparent conductive films 10 and 14 constituting the source electrode 6 and the drain electrode 11, respectively. Thus, the pixel electrode 16 is formed. This process is used to form the pixel electrode.

By forming the source electrode 6 and the drain electrode 11 of the thin film transistor 15 with a two-layered Ti film, and the transparent conductive film used for the pixel electrode 16 as described above, even if a pattern disconnection takes place in either of the Ti films 9 and 13 in the step part (as shown by a mark X in FIG. 1) extending onto the gate electrode line 18, this defect is repaired by patterning the source electrode 6 and the drain electrode 11 in the subsequent pixel forming process. Thereby, the probability of causing the point defect is reduced.

In addition, in the above-mentioned embodiment, we are describing only one thin film transistor and one pixel electrode, but it is needless to say that the above-mentioned configuration is formed in a matrix fashion to configurate a liquid crystal display device for an active-matrix display.

Therefore, in accordance with the present invention, the rate of producing point defects due to broken electrical connections in the source electrode and the drain electrode is reduced, and thereby a liquid crystal display device capable of improved yield rates and reliability to a great extent is obtainable.

What we claimed is:

1. A liquid crystal display device comprising:
   a plurality of thin film transistors formed on a transparent insulating substrate, in which each of the thin film transistors includes,
   a gate electrode formed on the transparent insulating substrate,
   a semiconductor film formed on the gate electrode by the mediation of a gate insulation film,
   a protective insulating film formed on the semiconductor film,
   a metal thin film laminated on the protective insulating film to provide a source electrode and a drain electrode, and
   a transparent conductive film laminated on said metal thin film to subsequently pattern said source and drain electrode thereon, said transparent conductive film for said drain electrode being extended to form a pixel electrode.

2. A liquid crystal display device as claimed in claim 1, wherein the semiconductor film is of amorphous silicon, the metal thin film is of titanium, and the transparent conductive film is of indium tin oxide.

3. A liquid crystal display device as claimed in claim 1, wherein the semiconductor film is made of amorphous silicon, the metal thin film is made of molybdenum, and the transparent conductive film is made of indium tin oxide.

4. A liquid crystal display device as claimed in claim 1, wherein the metal thin film has a film thickness of about 1000–5000 Å, and the transparent conductive film has a film thickness of about 500–about 30000 Å.

5. A liquid crystal display device as claimed in claim 2, wherein the metal thin film has a film thickness of about 100–about 5000 Å, and the transparent conductive film has a film thickness of about 500–about 3000 Å.

6. A liquid crystal display device as claimed in claim 3, wherein the metal thin film has a film thickness of about 100–about 5000 Å, and the transparent conductive film has a film thickness of about 500–about 3000 Å.

7. A method of forming a plurality of thin film transistors (TFT) on a transparent insulating substrate, each of said TFTs formed by a method comprising the steps of:
   (a) forming a gate electrode on the transparent insulating substrate;
   (b) forming a semiconductor film on the gate electrode by the mediation of a gate insulating film covering said gate electrode;
   (c) forming a protective insulating film on said semiconductor film;
   (d) laminating thin metal film onto said insulating film, thereby forming a source and drain electrode; and
   (e) laminating and patterning transparent conductive film onto said thin metal film thereby patterning the source and drain electrode and forming a pixel electrode from said transparent conductive film patterning said drain electrode.

8. A method, as claimed in claim 7, wherein each of said TFTs and subsequent pixel electrodes formed, are formed in a matrix fashion of rows and columns for producing a liquid crystal display device.

9. A method, as claimed in claim 7, wherein said semiconductor film is of amorphous silicon, said thin metal film is of titanium and said transparent conductive film is of indium tin oxide.

10. A method, as claimed in claim 7, wherein said semiconductor film is of amorphous silicon, said thin metal film is of molybdenum, and said transparent conductive film is of indium tin oxide.

11. A method as claimed in claim 7, wherein the metal thin film has a film thickness of about 1000-about 5000 Å, and the transparent conductive film has a film thickness of about 500-about 3000 Å.

12. A method, as claimed in claim 8, wherein said thin metal film has a film thickness of about 100-about 5000 Å, and said transparent conductive film has a thickness of about 500-3000 Å.

13. A method, as claimed in claim 9, wherein the metal thin film has a film thickness of about 100-about 5000 Å, and the transparent conductive film has a film thickness of about 500-about 3000 Å.

14. A method, as claimed in claim 10, wherein the metal thin film has a film thickness of about 100-about 5000 Å, and the transparent conductive film has a film thickness of about 500-about 3000 Å.

15. A method, as claimed in claim 8, wherein said semiconductor film is of amorphous silicon, said thin metal film is of titanium and said transparent conductive film is of indium tin oxide.

16. A method, as claimed in claim 8, wherein said semiconductor film is of amorphous silicon, said thin metal film is of molybdenum and said transparent conductive film is of indium tin oxide.

* * * * *